United States Patent [19]
Nakamura et al.

[11] Patent Number: 6,114,247
[45] Date of Patent: *Sep. 5, 2000

[54] POLISHING CLOTH FOR USE IN A CMP PROCESS AND A SURFACE TREATMENT THEREOF

[75] Inventors: Ko Nakamura; Sadahiro Kishii; Yoshihiro Arimoto, all of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/884,549

[22] Filed: Jun. 27, 1997

[30] Foreign Application Priority Data

Jun. 27, 1996 [JP] Japan .................................... 8-168041
Dec. 26, 1996 [JP] Japan .................................... 8-347918

[51] Int. Cl.⁷ .................................................. H01L 21/302
[52] U.S. Cl. ............................................ 438/692; 438/693
[58] Field of Search ........................................ 438/690, 691, 438/692, 693; 451/287

[56] References Cited

U.S. PATENT DOCUMENTS

| | | | |
|---|---|---|---|
| 5,167,667 | 12/1992 | Prigge et al. | 8/137 |
| 5,728,308 | 3/1998 | Muroyama | 216/88 |
| 5,763,325 | 6/1998 | Kishii et al. | 438/693 |
| 5,779,521 | 7/1998 | Muroyama et al. | 451/56 |

*Primary Examiner*—Benjamin L. Utech
*Assistant Examiner*—Kin-Chan Chen
*Attorney, Agent, or Firm*—Armstrong, Westerman, Hattori, McLeland & Naughton

[57] ABSTRACT

A method of fabricating a semiconductor device includes a step of polishing a surface of a substrate by a chemical mechanical polishing process conducted on a polishing cloth by a slurry. The polishing is conducted so that projections having a height of about 30 μm or less are formed on the polishing cloth with an interval of about 55 μm or less as a result of the polishing.

9 Claims, 10 Drawing Sheets

POLISHING CLOTH FOR USE IN A CMP PROCESS AND A SURFACE TREATMENT THEREOF

BACKGROUND OF THE INVENTION

The present invention generally relates to the art of chemical mechanical polishing for use in fabrication of semiconductor devices and more particularly to a polishing cloth for use in a chemical mechanical polishing process, including a surface treatment thereof.

With recent progress in the fabrication of very large scale integrated circuits, the number of devices included in an integrated circuit is increasing. Associated therewith, the degree of complexity of interconnection patterns used in an integrated circuit for interconnecting various devices is also increasing. In order to realize such complex interconnection patterns, recent advanced integrated circuits tend to use so-called multilayer interconnection structure, in which the interconnection pattern is provided in a plurality of layers, with intervening interlayer insulation films.

On the other hand, such a multilayer interconnection structure tends to cause a problem of increased step height on an interlayer insulation film covering an underlying interconnection pattern. Due to the increased step height, there is a substantial risk that an interconnection pattern provided above interlayer insulation film may experience distortion or disconnection. Further, such an irregularity at the top surface of the interlayer insulation film tends to cause a problem of poor patterning of the interconnection pattern due to the limited focal depth of the high-resolution optical system used for exposing such extremely miniaturized interconnection patterns. This problem becomes particularly acute in recent advanced integrated circuits having a very large integration density.

Thus, planarization is a paramount problem in realizing a multilayer interconnection structure, and various investigations have being undertaken for overcoming this problem.

Conventionally, the planarization has been conducted by providing the interlayer insulation film as a low-viscosity material such as an SOG (spin-on-glass) or a low melting silicate glass containing B or P. However, such a conventional planarization process becomes less effective in CMOS devices having a design rule of 0.35 $\mu$m or less, in which a further degree of planarization is required for the entire wafer surface.

The art of chemical mechanical polishing referred to hereinafter as CMP is a technology that can meet such a stringent demand. By using a CMP process, it is possible to planarize a wafer substantially completely and eliminate projections or depressions from the surface of the wafer.

FIG.1 shows the construction of a polishing apparatus for use in a CMP process of a semiconductor substrate.

Referring to FIG. 1, the polishing apparatus includes a rotary disk or platen 10 covered by a polishing cloth 12. Further, a rotary polishing head 14 is provided on the platen 10 so as to face the top surface of the platen 10 covered by the polishing cloth 12. The polishing head 14 holds thereon a substrate 16 to be polished, and there is provided a slurry nozzle 20 above the platen 10 such that the slurry nozzle 20 drops a slurry 18 on the polishing cloth 12.

In operation, the platen 10 and the polishing head 14 are driven at respective predetermined speeds while the slurry is dripped on the polishing cloth 12, and the polishing head 14 urges the substrate 16 against the polishing cloth 12 with a predetermined urging force or pressure. Conventionally, a slurry in which alumina or colloidal silica abrasives are dispersed in an alkaline solvent has been used for the slurry 18. Further, a foamed polymer such as a polyurethane sheet has been used for the polishing cloth 12.

In such a CMP process conducted by the polishing apparatus of FIG.1, it should be noted that the surface state of the polishing cloth 12 provides a profound influence on the mechanism of polishing, including retention of the slurry 18 thereon. Thus, in order to achieve an optimized polishing, it is necessary to control the surface state of the polishing cloth 12.

In the conventional polishing cloth 12, the surface of the cloth 12 includes minute projections and depressions that are formed merely by chance by a foaming process that occurs at the time of manufacturing the polishing cloth 12. In other words, the surface state of the conventional polishing cloth 12 is controlled merely by chance. Thus, the conventional CMP process conducted by using such a conventional polishing cloth 12 is difficult to be optimized, and there has been difficulty in polishing the substrate 16 with a constant polishing rate and with reproducibility.

There are polishing cloths that include grooves or minute depressions for holding the slurry. However, the size of the grooves or depressions in such conventional polishing cloths is on the order of millimeters, while such large depressions are not effective for improving the polishing process.

In order to be effective, the grooves on the polishing cloth should have a size range of microns. At the same time, there has been no effective means for forming such minute grooves in the polishing cloth. While there is a proposal to grind the surface of the polishing cloth by a tool that carries thereon electrodeposited diamond abrasives such that grooves of micron size are formed on the surface of the polishing cloth, there has no investigation as to what process should be the optimum.

After a continuous use, the polishing cloth tends to collect particles that are formed as a result of the polishing. The particles may include worn out abrasives. In conventional polishing cloths, it has been difficult to remove such particles without affecting the performance of the polishing cloth.

SUMMARY OF THE INVENTION

Accordingly, it is a general object of the present invention to provide a novel and useful polishing cloth and a surface treatment thereof wherein the foregoing problems are eliminated.

Another and more specific object of the present invention is to provide a polishing cloth that provides a maximum polishing rate for a prolonged duration when used in a CMP process, as well as a surface treatment of the polishing cloth for maintaining the performance.

Another object of the present invention is to provide a cleaning process for a used polishing cloth.

Another object of the present invention is to provide a polishing cloth for a chemical mechanical polishing process, comprising:

a cloth base having a surface; and projections and depressions formed on said surface, said projection having a height of 30 $\mu$m or less and formed with an interval of 55 $\mu$m or less.

According to the present invention, the contact area of the polishing cloth to a substrate, which is subjected to the polishing process, is maximized, and hence the polishing rate is maximized. Further, the existence of such projections and depressions on the polishing cloth improves the retention of the slurry on the polishing cloth during the polishing process.

Another object of the present invention is to provide a method of treating a surface of a polishing cloth for use in a chemical mechanical polishing process, comprising the step of:

treating a surface of said polishing cloth with a slurry used for said chemical mechanical polishing process, said treating being conducted such that projections and depressions are formed on said surface, with a height of 30 µm or less and with an interval of 55 µm or less.

Another object of the present invention is to provide a surface treatment method of a polishing cloth for use in a chemical mechanical polishing process, comprising the step of:

roughening a surface of said polishing cloth by a tool carrying diamond abrasives, said diamond abrasives having a diameter of 30 µm or less.

According to the present invention, the optimization of the polishing cloth surface is achieved either simultaneously with the polishing process or prior to the polishing process. By forming the projections and depressions as set forth above, the contact area of the polishing cloth to a substrate, which is subjected to the polishing process, is maximized, and hence the polishing rate is maximized. Further, the existence of such projections and depressions improves the retention of the slurry on the polishing cloth during the polishing process.

Another object of the present invention is to provide a method of cleaning a polishing cloth for use in a chemical mechanical polishing process, comprising the step of:

removing abrasives attached to said polishing cloth by a chemical reaction that reacts upon said abrasives.

According to the present invention, the initial state of the polishing cloth is recovered whenever the CMP process is finished by dissolving the abrasives. Thereby, the polishing cloth can be used repeatedly, each time guaranteeing a high polishing rate. Further, the lifetime of the polishing cloth is extended.

Another object of the present invention is to provide a method of fabricating a semiconductor device, comprising a step of:

polishing a surface of a substrate by a chemical mechanical polishing process conducted on a polishing cloth by a slurry, said polishing step being conducted such that projections having a height of 30 µm or less are formed on said polishing cloth with an interval of 55 µm or less as a result of said polishing.

According to the present invention, the chemical mechanical polishing process is conducted at a high polishing rate with excellent reproducibility. Thereby, the fabrication cost of the semiconductor device is reduced substantially.

Other objects and further features of the present invention will become apparent from the following detailed description when read in conjunction with the attached drawings.

DETAILED DESCRIPTION OF THE PREFERRED EMBODIMENTS

[First Embodiment]

Figure 2:
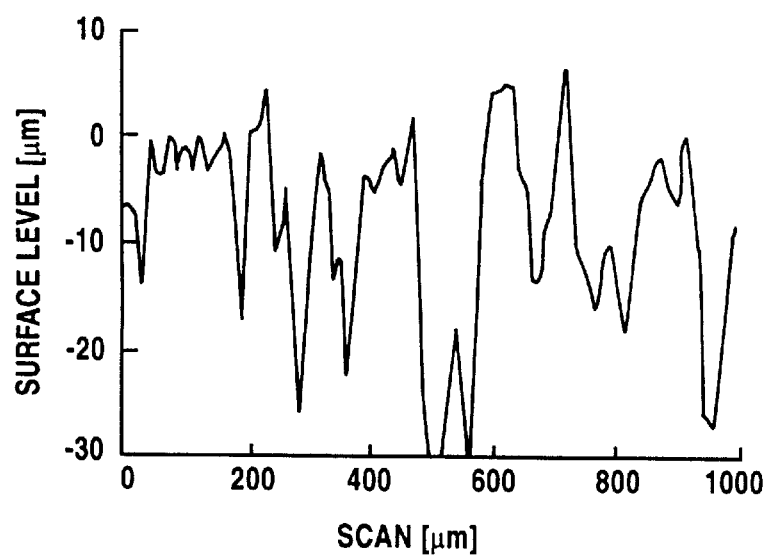
FIG. 2 is a diagram showing the surface state of a commercially available polishing cloth.

FIG. 2 shows the surface roughness of a commercially available polyurethane polishing cloth for a CMP process.

Referring to FIG. 2, the polishing cloth, in which minute projections and depressions are formed as a result of foaming at the time of manufacturing of the polishing cloth, shows irregular projections and depressions on the surface thereof, wherein the irregularity is observed both in the depth and the interval or pitch of the projections. There is no particular frequency component observed in the pattern of FIG. 2. In fact, some of the projections have a height of 30 µm or more, while some of the projections have a very small height which is barely recognizable. Further, some of the projections are disposed with an interval exceeding 55 µm, while some are disposed with a very small interval.

In a polishing cloth for a CMP process, it is desired to maximize the area of the polishing cloth that contacts the substrate during the polishing process. Generally, the polishing rate and the contact area of the polishing cloth to the substrate to be polished is proportional. In other words, it is important and desired in a CMP process to increase the contact area of the polishing cloth to the substrate as much as possible. In the polishing cloth having the surface roughness profile of FIG. 2, however, only the highest peaks make such a desired contact, while a substantial part of the polishing cloth, including the lower peaks, does not contact the substrate at all.

Figure 3A:
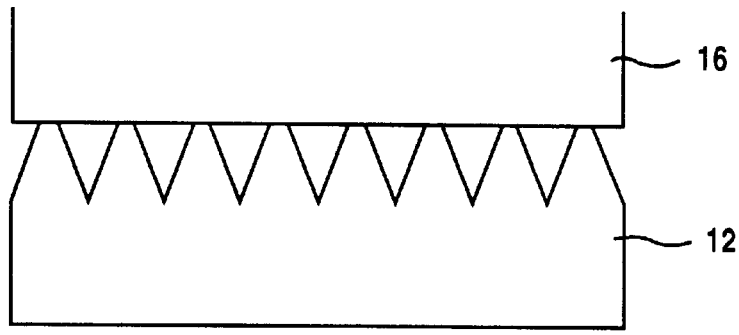
FIGS. 3A, 3B, and 3C are diagrams showing the mechanism o polishing for various surface states of the polishing cloth according to a first embodiment of the present invention.

FIG. 3A shows a desired surface roughness profile achieved according to a first embodiment of the present invention, in which it should be noted that the projections of the polishing cloth are formed uniformly, with substantially a uniform interval and substantially a uniform height. The process of forming such uniform projections on the polishing cloth will be explained later with reference to a different embodiment.

Figure 3B:
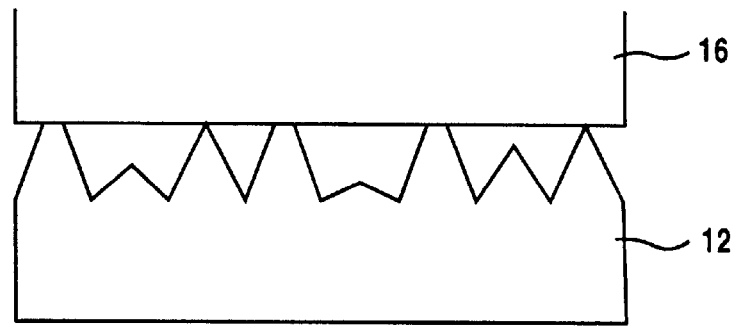

By using the polishing cloth of FIG. 3A, a polishing rate of about 70 nm/min was obtained for a thermal oxide film formed on a Si substrate, as will be explained in detail below. On the other hand, the polishing rate was decreased to about 26 nm/min in the case in which the polishing cloth of FIG. 3B was used. In the polishing cloth of FIG. 3B, it should be noted that there are substantial variations in the height of the projections. The foregoing finding indicates that it is essential to increase the area of contact of the polishing cloth for achieving a large polishing rate.

Figure 3C:
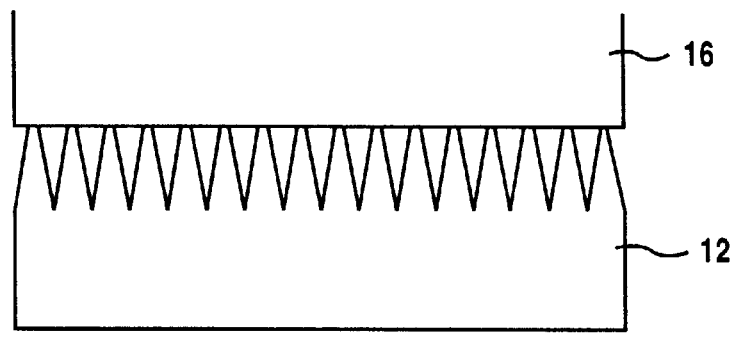

Further, as indicated in FIG. 3C, it was discovered that the polishing rate increased to about 140 nm/min, by decreasing the interval of the projections by about twice as small as in the case of FIG. 3A. Thus, the interval or pitch of the projection is also an important factor for increasing the polishing rate.

Figure 4:
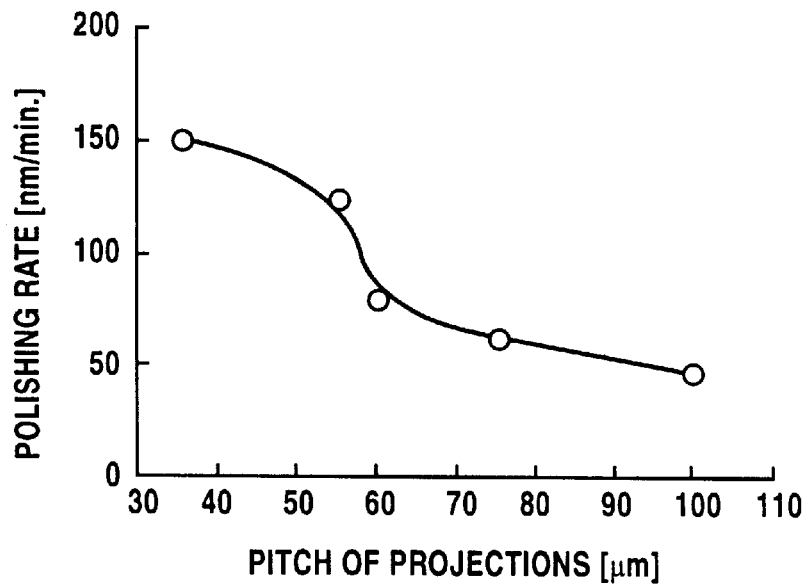
FIG. 4 is a diagram showing the relationship between a polishing rate and an interval or pitch of the projections on the polishing cloth.
Figure 5:
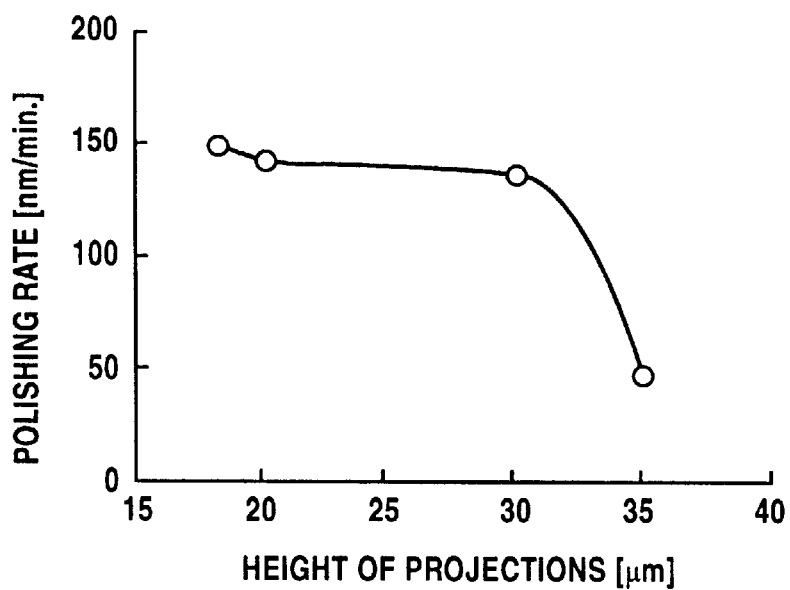
FIG. 5 is a diagram showing the relationship between a polishing rate and a height of the projections on the polishing cloth.

FIGS. 4 and 5 show the result of the investigations conducted by the inventors of the present invention about the surface state of the polishing cloth for maximizing the polishing rate, wherein FIG. 4 shows the relationship between the interval of the projections on the polishing cloth surface and the polishing rate, while FIG. 5 shows the relationship between the height of the projections and the polishing rate.

In all of the experiments, the polishing was made on a test piece that includes a thermal oxide film formed on a Si substrate as noted before. The test piece was held on the polishing head 14 rotating at a speed of 80 rpm, and the polishing was applied to the foregoing thermal oxide film on a platen 10 also rotating at a speed of 80 rpm. The platen 10 was covered by an IC-1000 cloth, and a SUBA400 cloth supplied from Rodel-Nitta was provided further thereon. During the polishing, a slurry containing $MnO_2$ abrasives having an average grain size of 0.3 $\mu$m was supplied together with a solvent such as $H_2O$. The polishing was made while urging the test piece against the platen with a pressure of 0.21 kg/cm$^2$.

Referring to FIG. 4, it should be noted that the polishing rate increases with decreasing interval of the projections on the polishing cloth. Particularly, the polishing rate increases sharply when the interval is reduced below about 60 $\mu$m. For example, the polishing rate of about 125 nm/min can be increased to about 150 nm/min by decreasing the interval from about 55 $\mu$m to 35 $\mu$m. The latter value of the polishing rate of 150 nm/min is almost three times as fast as the case in which the projections are formed with an interval of 100 $\mu$m. Thus, the result of FIG. 4 indicates that it is preferable to form the projections with an interval of about 55 $\mu$m or less. Obviously, this increase of the polishing rate is a result of the increased contact area of the polishing cloth to the test piece.

Further, FIG. 5 indicates that the polishing rate increases also by decreasing the height of the projections. Referring to FIG. 5, it should be noted that the polishing rate increases sharply when the height of the projections is reduced to about 35 $\mu$m or less. For example, a polishing rate of about 140 nm/min is achieved by setting the height of the projections to about 30 $\mu$m or less. Thus, the result of FIG. 5 indicates that it is preferable to form the projections with a height of about 30 $\mu$m or less. Again, this increase of the polishing rate is deemed to be the result of an increased contact area of the polishing cloth to the test piece.

When the interval or height of the projections is excessively small, on the other hand, the retention of the slurry on the polishing cloth becomes difficult. Thus, it is not desirable to form the surface of the polishing cloth so as to be completely flat.

[Second Embodiment]

Figure 6:
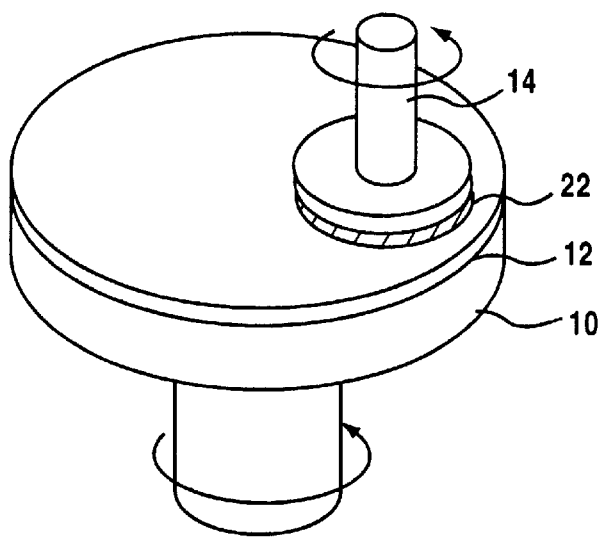
FIG. 6 is a diagram showing the construction of a polishing apparatus used for the surface treatment of the polishing cloth according to a second embodiment of the present invention.

FIG. 6 shows the construction of an apparatus for treating the surface of a polishing cloth according to a second embodiment of the present invention.

In the first embodiment of the present invention, it was discovered that a polishing cloth preferably has projections on the surface thereof with an interval of about 55 $\mu$m or less and with a height of about 30 $\mu$m or less for increasing the polishing rate. However, commercially available polishing cloths do not posses such a preferable feature discovered by the present invention. Thus, it is necessary to devise a process or apparatus for treating the surface of such commercially available polishing cloths to form the desired projections thereon as noted above.

FIG. 6 shows the construction of an apparatus used in the present embodiment for treating the surface of a polishing cloth according to the teaching of the first embodiment of the present invention.

Figure 1:
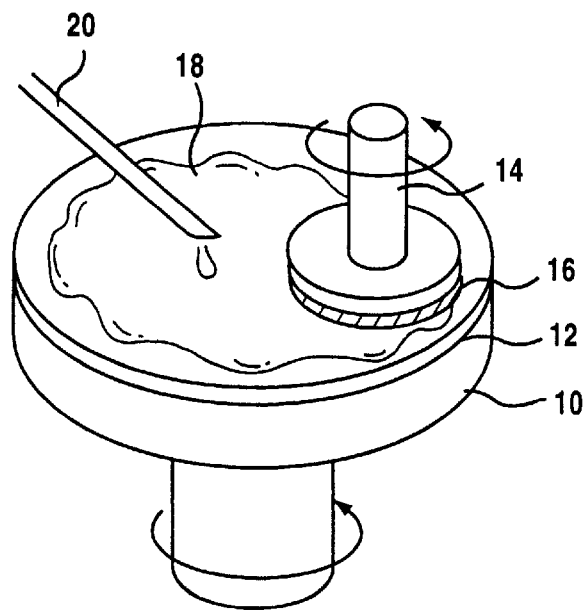
FIG. 1 is a diagram showing the construction of a conventional polishing apparatus.

Referring to FIG. 6, the surface treatment apparatus has a construction identical to that of the polishing apparatus of FIG.1 and includes the rotatable platen 10 carrying the polishing cloth 12, which is subjected to the surface treatment. Further, the rotatable polishing head 14 is disposed above the platen 10 covered by the polishing cloth 12, wherein the polishing head 14 now holds a tool 22 carrying thereon electrodeposited diamond abrasives.

In operation, the platen 10 is driven and the tool 22 is applied to the polishing cloth 12 by driving the polishing head 14 such that the diamond abrasives on the tool 22 grind the surface of the polishing cloth 12. As a result of the grinding, the polishing cloth 12 is provided with depressions and associated projections as noted in the previous embodiment.

It should be noted that the profile of the projections and depressions thus formed on the surface of the polishing cloth 12 changes with the diameter of the diamond abrasives provided on the tool 22. In the present embodiment, the diamond abrasives are chosen to have a diameter such that the height of the projections formed as a result of the surface treatment are about 30 $\mu$m or less. For example, a tool carrying the diamond abrasives with a diameter of about 30 $\mu$m may be used for the tool 22 when forming the projections on the surface of the polishing cloth 12 with a height of about 15 $\mu$m. It should be noted that the diamond abrasives used in the present invention have a diameter slightly smaller than the diameter of about 60 $\mu$m, which is used conventionally for diamond abrasives.

The diameter of the diamond abrasives used in the tool 22 also controls the pitch or interval of the projections formed on the polishing cloth surface. For example, an interval of about 30 $\mu$m is obtained for the projections, by setting the diameter of the diamond abrasives to be about 30 $\mu$m. It is possible to form the projections on the polishing cloth 12 with the desired height of about 30 $\mu$m or less and with the desired interval of about 55 $\mu$m or less, by setting the diameter of the diamond abrasives on the tool 22 to be about 30 $\mu$m or less.

During the grinding process of the polishing cloth 12 by the tool 22, it should be noted that a single path of the tool 22 is sufficient over the polishing cloth 12, as long as the polishing head 14 is urged with a sufficient pressure. A second or third path is generally not necessary. Thereby, the desired projections are formed on the polishing cloth 12 by applying the tool 22 over the polishing cloth 12 only once, with a uniform urging pressure. During this process, it is preferable to set the urging pressure of the head 14 such that the diamond abrasives do not completely sink or cut into the polishing cloth 12 completely.

Thus, by applying the tool 22 over the polishing cloth 12 with the diamond abrasives of a suitable diameter electrodeposited thereon, it is possible to form the projections on the surface of the polishing cloth according to the teaching of the first embodiment.

By using the polishing cloth 12 for the polishing of a substrate, stable polishing can be performed at a high polishing rate.

[Third Embodiment]

In the previous embodiment, the surface treatment of the polishing cloth was conducted by the apparatus of FIG. 6 that uses the tool 22. In other words, the surface treatment of the previous embodiment was conducted separately from the polishing process.

In the present embodiment, a process of surface treatment of the polishing cloth will be disclosed in which the surface treatment of the polishing cloth is conducted concurrently with the polishing process.

The present embodiment conducts the polishing by using the polishing apparatus of FIG. 1, wherein the polishing head 14 carries the substrate 16 to be polished in place of the tool 22. The substrate 16 may carry an insulation layer such as a silicon oxide film or a semiconductor layer such as a polysilicon film thereon for polishing. Further, the substrate 16 may carry a conductor layer or pattern such as Si or W.

In operation, the platen 10 and the polishing head 14 are driven at respective predetermined speeds, and the polishing is conducted by urging the head 14 against the polishing cloth 12, while the slurry 18 is dripped on the polishing cloth 12 simultaneously. During the polishing process, not only the substrate 16 is polished, but the polishing cloth 12 is treated also by the abrasives of the slurry 18, and the desired projections and depressions are formed on the surface of the polishing cloth 12.

The present embodiment employs a slurry that contains manganese oxide abrasives for the slurry 18, wherein the manganese oxide is represented by $MnO_x$ ($1 \leq x \leq 2$). Preferably, the manganese oxide is any of $MnO_2$, $Mn_2O_3$ or $Mn_3O_4$ or a mixture thereof.

It should be noted that conventional slurries generally use silica or alumina abrasive particles in combination with an alkaline solvent. For example, the slurry that uses colloidal silica abrasives uses an alkaline solvent that contains K. When such an alkaline slurry is used in the polishing process of FIG. 1 for the slurry 18, the polishing cloth 12 tends to experience a chemical process that causes a planarization in the surface thereof as a result of the reaction by the alkaline solvent. Thus, the conventional CMP process has failed to form the desired projections and depressions on the surface of the polishing cloth 12 during the polishing process.

Contrary to the conventional CMP process, the process of the present embodiment that uses the foregoing manganese oxide abrasives in the slurry 18 in combination with the solvent of $H_2O$, is advantageous in that the solvent of the slurry 18 is no longer required to be alkaline. It should be noted that the slurry that uses the foregoing manganese oxide abrasives is effective for the CMP process even when the K content in the solvent is reduced below 900 ppm. In contrast, conventional slurries such as the one that uses a colloidal silica slurry shows a significant decrease of the polishing rate when the K content in the solvent is reduced as such, and the use thereof in the fabrication process of a semiconductor device is not practical.

Figure 7:
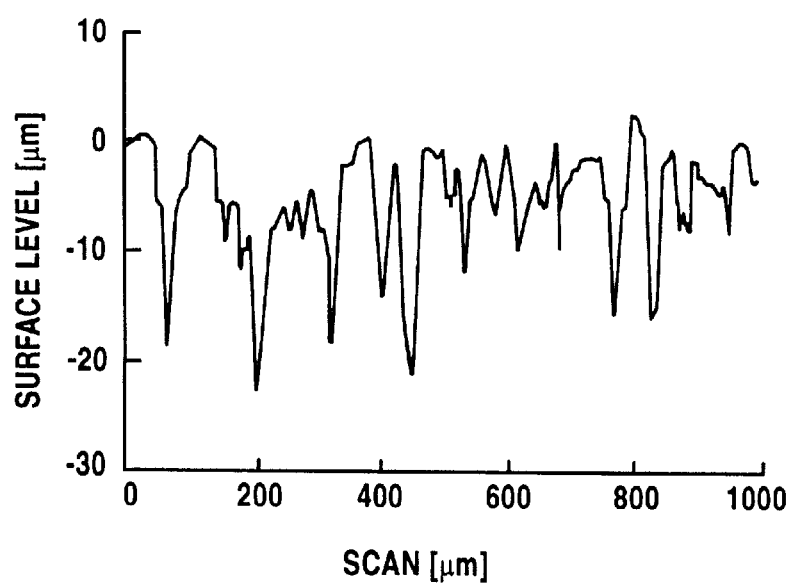
FIG. 7 is a diagram showing the surface state of a polishing cloth treated by $MnO_2$ abrasives according to a third embodiment of the present invention.
Figure 8:
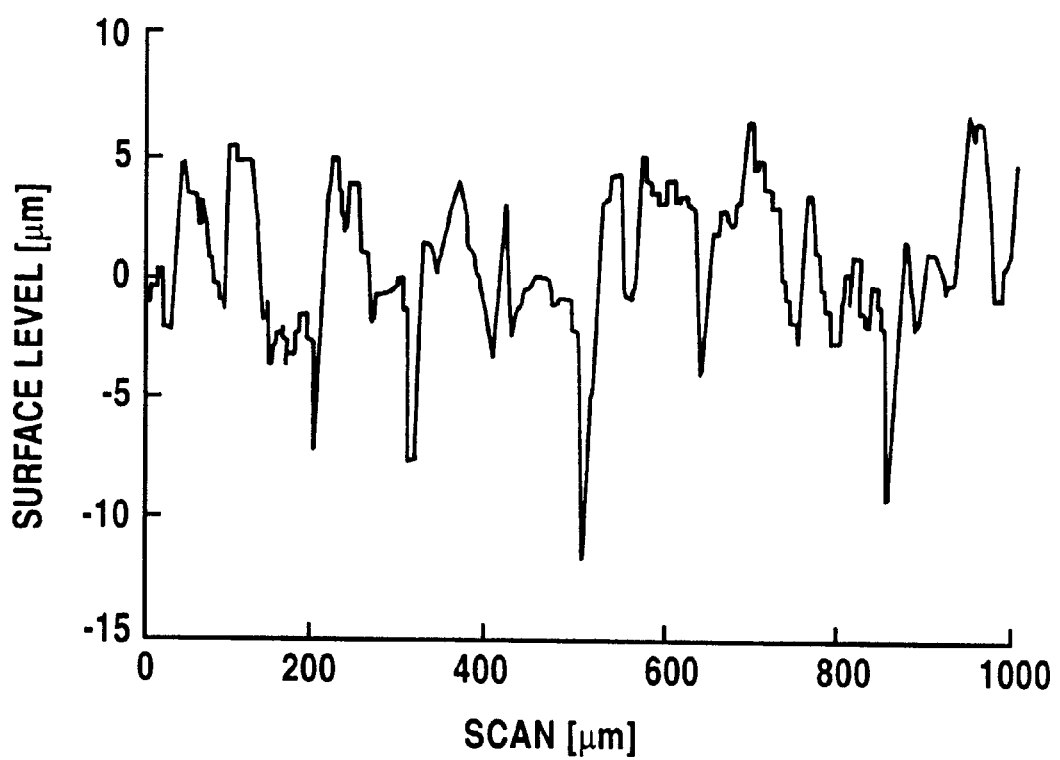
FIG. 8 is a diagram showing the surface state of a polishing cloth treated by $Mn_2O_3$ abrasives according to the third embodiment.

FIGS. 7 and 8 show the surface profile of the polishing cloth 12 obtained as a result of the polishing conducted by the apparatus of FIG. 1 on a thermal oxide film on the Si substrate 16, wherein FIG. 7 shows the result in which $MnO_2$ abrasive particles are used for the slurry 18, while FIG. 8 shows the result in which $Mn_2O_3$ particles are used. In both cases, the average diameter of the abrasive particles was about 0.3 μm.

In more detail, the polishing was conducted in both cases of FIG. 7 and FIG. 8 by using the foregoing SUBA400 cloth provided on the IC-1000 cloth while urging the substrate 16 to the platen with a pressure of 0.21 $kg/cm^2$. The polishing head 14 and the platen 10 were driven at the same rotational speed of 80 rpm.

Referring to FIGS. 7 and 8, the projections are formed on the surface of the polishing cloth 12 as a result of the process of the present embodiment, with an interval or pitch of about 55 μm or less. As demonstrated in FIGS. 7 and 8, the height of the projections thus formed is about 30 μm or less. A similar result was obtained also in the case in which $Mn_3O_4$ abrasives having an average diameter of 0.3 μm are used in the slurry 18.

The result of FIGS. 7 and 8 indicates clearly that a high polishing rate is achieved continuously and stably by treating the surface of the polishing cloth 12 by the manganese oxide slurry 18 that uses abrasives of $MnO_x$, where $1 \leq x \leq 2$ such as $MnO_2$, $Mn_2O_3$, $Mn_3O_4$ or a mixture thereof, during the polishing process.

In the present embodiment, it is of course possible to apply the roughening process to the polishing cloth 12 separately from the polishing process of the substrate 16 by using the construction of FIG. 6. In this case, too, the use of manganese oxide slurry is recommended even when the polishing itself is made by a conventional slurry such as a colloidal silica slurry or an alumina slurry, as the manganese oxide abrasives are easily and completely removed from the polishing cloth 12 by an acid bath process to be described below, without substantially damaging the projections and depressions formed on the polishing cloth.

It should be noted that continuous use of a polishing cloth invites a deposition of abrasive particles on the polishing cloth, wherein the abrasive particles thus deposited adhere to the polishing cloth and the removal thereof has been difficult. This applies to the conventional slurry that uses colloidal silica or alumina abrasives.

In the case of the slurry that uses the foregoing manganese oxide ($MnO_x$, $1 \leq x \leq 2$) abrasives as in the second or third embodiment, it is possible to remove the adhered abrasives from the polishing cloth chemically, by dissolving the manganese oxide abrasives into an acid such as HCl or a mixture of HCl and $H_2O_2$. Thereby, the removal is made without using a mechanical means or method such as scraping, and the abrasives are removed from the polishing cloth without modifying or destroying the projections formed on the surface of the polishing cloth.

In the case of the slurry that uses the colloidal silica abrasives, on the other hand, it is also possible to remove the abrasives by dissolving the abrasives into HF.

[Experiment]

Hereinafter, the examples of the present invention, conducted by the polishing apparatus of FIG. 1, for polishing the substrate 10 simultaneously with the surface treatment of the polishing cloth 12 will be described with reference to FIGS. 9 and 10.

In the experiment, the polishing rate achieved for a thermal oxide film by a polishing cloth was measured for the case in which the surface of the polishing cloth was treated by the manganese oxide slurry containing abrasives such as $MnO_2$, $Mn_2O_3$ or $Mn_3O_4$. Further, for the sake of comparison, the polishing rate was measured also for the case in which the surface of the polishing cloth was treated by the conventional diamond abrasives.

More specifically, the polishing was applied to a thermal oxide film formed on a Si substrate held on the polishing head 14 of FIG. 1 as the substrate 16, while using the abrasives of $MnO_2$, $Mn_2O_3$ or $Mn_3O_4$ having an average grain size of about 0.3 μm in the slurry. In the polishing, the platen 10 was covered by the IC-1000 cloth on which the SUBA400 cloth was provided further. Further, the polishing pressure was set to 0.21 kg/cm$^2$, and the polishing head 14 as well as the platen 10 were rotated at a speed of 80 rpm.

In the comparative experiment, the same polishing cloth of IC-1000/SUBA400 on the platen 10 was subjected to the surface treatment process by using the construction of FIG. 6 that uses the tool 12 on which the electrodeposited diamond abrasives of about 60 μm grain size are carried. In the comparative experiment, the platen 10 was driven at a rotational speed of 100 rpm and the process was continued for 1 minute.

In the comparative experiment, the polishing cloth thus processed was then used in the construction of FIG. 1 for polishing a thermal oxide film formed on a Si substrate by the slurry containing the manganese oxide abrasives similarly as before. During the polishing process, the polishing head 14 was urged against the platen 10 with a pressure of 0.21 kg/cm$^2$ while driving the polishing head 14 and the platen 10 at a rotational speed of 80 rpm.

Figure 9:
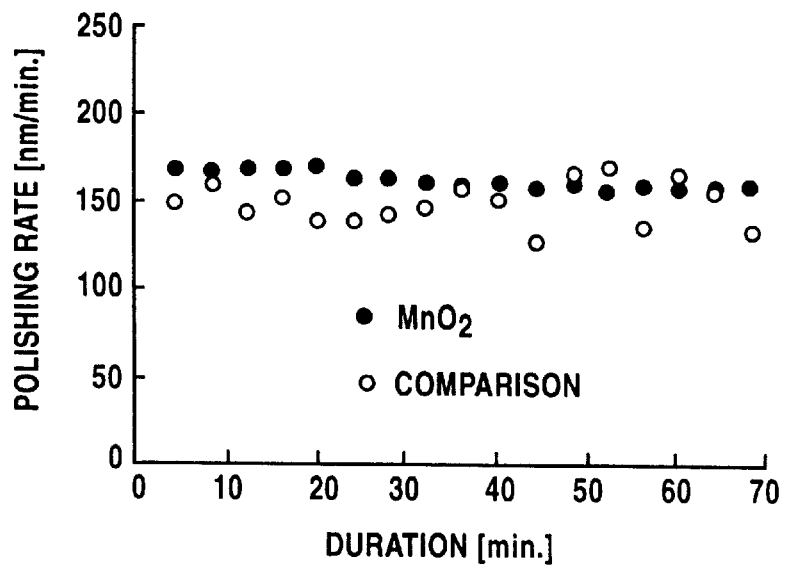
FIG. 9 is a diagram showing a change of the polishing rate with time for the case in which $MnO_2$ abrasives are used.

Referring to FIG. 9 showing the relationship between the polishing rate and the polishing duration, the solid circles show the result for the case in which the slurry containing the $MnO_2$ abrasives was used for the polishing cloth treatment and simultaneously for polishing of the thermal oxide film. The open circles of FIG. 9 show the comparative experiments, in which the polishing of the thermal oxide film was made by the $MnO_2$ abrasives after the surface treatment by the construction of FIG. 6 by using the tool 22.

In FIG. 9, it will be noted that the present invention as represented by the solid circles generally provides a superior polishing rate to the comparative experiments. More importantly, the scattering of the present invention is substantially less than the scattering of the comparative experiments, indicating that the present invention provides an excellent reproducibility or stability of the polishing process. It should be noted that the scattering of the solid circles in FIG. 9 is about 3.7 nm/min in terms of the standard deviation, while the standard deviation of the open circles was about 12.5 nm/min.

Figure 10:
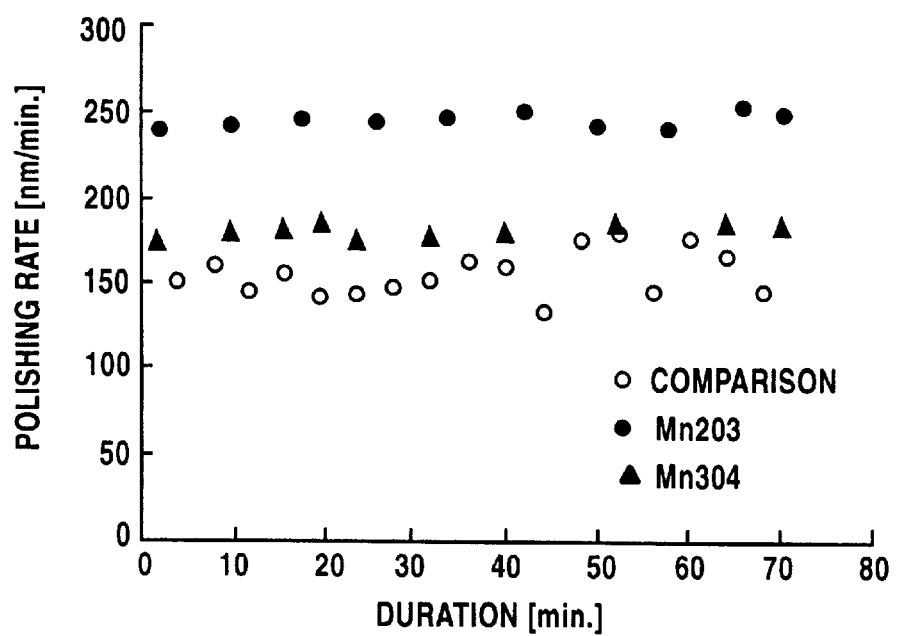
FIG. 10 is a diagram showing a change of the polishing rate with time for the case in which $Mn_2O_3$ abrasives are used.

FIG. 10 shows the result for the case in which the polishing cloth was treated by the $Mn_2O_3$ or $Mn_3O_4$ slurries simultaneously with the polishing in comparison with the foregoing comparative experiment.

Referring to FIG. 10, it is clearly seen that the polishing rate achieved by the simultaneous treatment of the polishing cloth by the $Mn_2O_3$ slurry is much superior to the polishing rate achieved by the conventional process. Further, the polishing rate achieved by the simultaneous treatment of the $Mn_3O_4$ slurry is generally superior to the polishing rate achieved by the conventional process. In any of the cases in which the polishing cloth is treated simultaneously with the polishing by the $Mn_2O_3$ or $Mn_3O_4$ slurry, the scattering of the polishing rate is very small, about 3.8 nm/min in terms of the standard deviation for the $Mn_2O_3$ slurry or about 3.2 nm/min for the $Mn_3O_4$ slurry also in terms of the standard deviation. Thus, it is again concluded that the surface treatment of the polishing cloth by the $Mn_2O_3$ or $Mn_3O_4$ abrasives conducted concurrently with the polishing, stabilizes the polishing process substantially.

[Fourth Embodiment]

FIGS. 11A, 11B, 11C, 11D, 11E, 11F, 11G, 11H, 11I, 11J, 11K, and 11L are diagrams showing the fabrication process of a semiconductor device including a multilayer interconnection structure according to a fourth embodiment of the present invention.

Figure 11A:
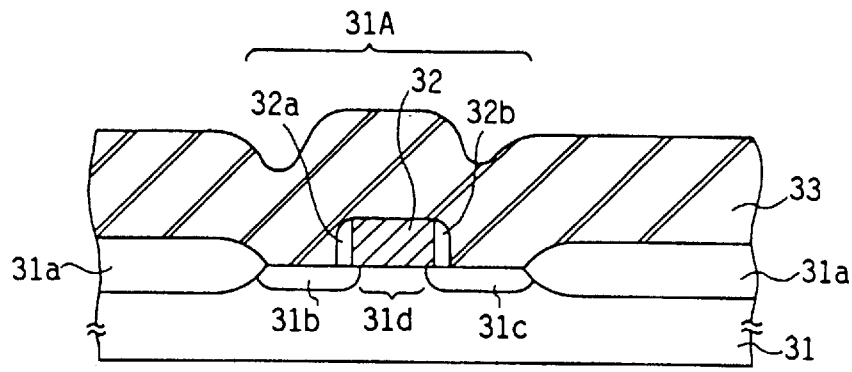
FIGS. 11A, 11B, 11D, 11E, 11F, 11G, 11H, 11I, 11J, 11K, and 11L are diagrams showing the fabrication process of a semiconductor device according to a fourth embodiment of the present invention.

Referring to FIG. 11A, a Si substrate 31 is defined with an active region 31A by a field oxide film 31a, and a gate electrode 32 is provided on the substrate 31 in the active region 31A, with a gate insulation film (not shown) intervening between the substrate 31 and the gate electrode 32. Further, the substrate 31 is formed with diffusion regions 31b and 31c at both sides of the gate electrode 32 and a channel region 31d is defined in the substrate 31 immediately below the gate electrode 32. The gate electrode 32 carries side wall oxide films 32a and 32b at both lateral side walls thereof, and an interlayer insulation film 33 typically of $SiO_2$ is provided on the substrate 31 by a CVD process such that the interlayer insulation film 33 covers the gate electrode 32 including the side wall oxide films 32a and 32b.

Figure 11B:
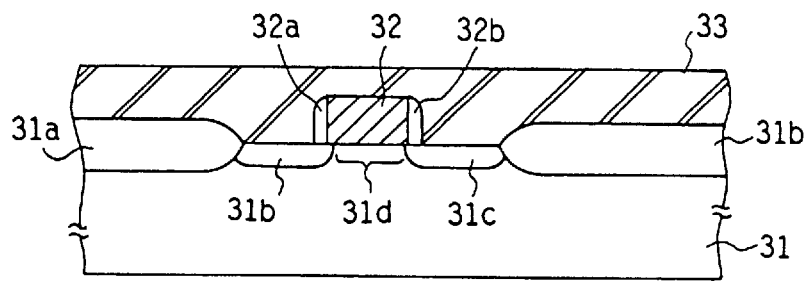

As will be noted from FIG. 11A, the interlayer insulation film 33 thus formed has a projection and depression at a top surface thereof in correspondence to the gate electrode 32, and thus, the structure of FIG. 11A is planarized in the step of FIG. 11B by polishing the interlayer insulation film by a CMP process that uses a slurry in combination with the construction of FIG. 1, in which abrasives of $Mn_2O_3$ or $Mn_3O_4$ are dispersed in a suitable solvent such as $H_2O$. By doing so, a polishing rate more than three times greater as the conventional polishing rate is achieved by using a slurry that contains $Mn_2O_3$ abrasives for this purpose in place of a conventional colloidal silica slurry. Further, a polishing rate of more than twice as much as the conventional polishing rate is obtained when a slurry that contains $Mn_3O_4$ abrasives is used for the same purpose.

Figure 11C:
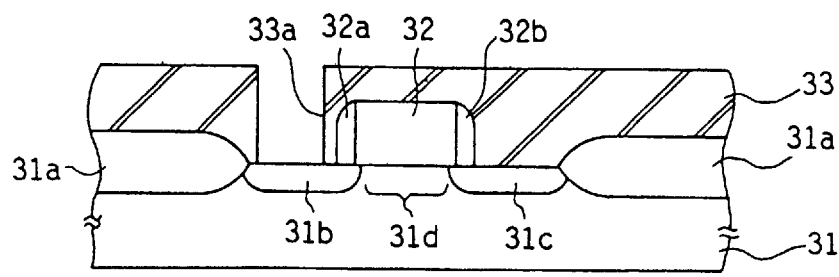
Figure 11D:
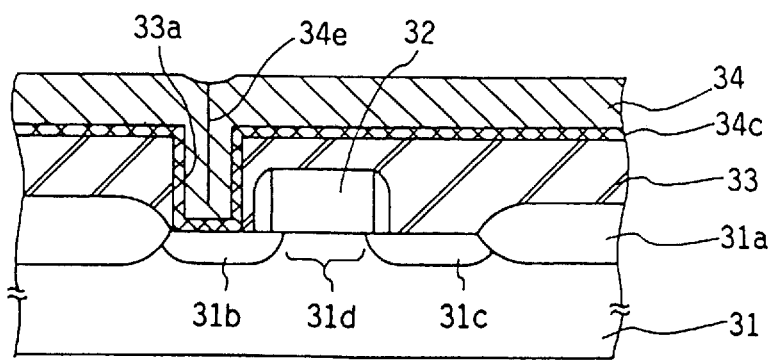

Next, in the step of FIG. 11C, the interlayer insulation film 33 thus planarized is formed with a contact hole 33a so as to expose the diffusion region 31b, and a TiN layer 34c and a W layer 34 are deposited on the structure of FIG. 11C consecutively by a sputtering process or a CVD process.

Figure 11E:
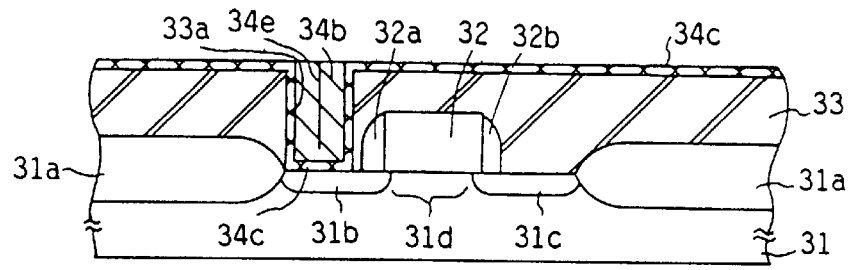

The W film 34 thus deposited is then removed in the step of FIG. 11E by a CMP process that uses $MnO_2$ abrasives, and a structure in which a W plug 34b fills the contact hole 33a is obtained as indicated in FIG. 11E. In the process of FIG. 11E, it should be noted that the TiN layer 34c remains more or less intact. While the W plug 34b thus formed includes a seam 34be at a central part thereof as a result of the lateral growth of the W layer in the contact hole 33a at the time of the deposition, the problem of erosion of the seam by a liquid oxidant such as $H_2O_2$ is successfully avoided by using the $MnO_2$ abrasives. It should be noted that the $MnO_2$ abrasives in the slurry acts as a solid oxidant and do not penetrate into the seam 34e even during the polishing process of the W layer 34.

Figure 11F:
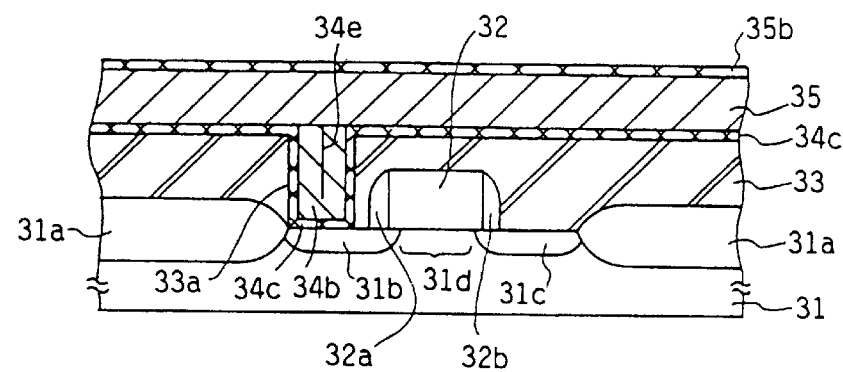

Next, in the step of FIG. 11F, a thin Ti film (not shown) is formed on the structure of FIG. 11E by a sputtering process or a CVD process, and a conductor layer 35 of Al or an Al alloy is formed on the structure of FIG. 11E. Further, a thin Ti layer (not shown) is deposited on the conductor layer 35, and a TiN layer 35b is formed further thereon by a sputtering process or a CVD process.

Figure 11G:
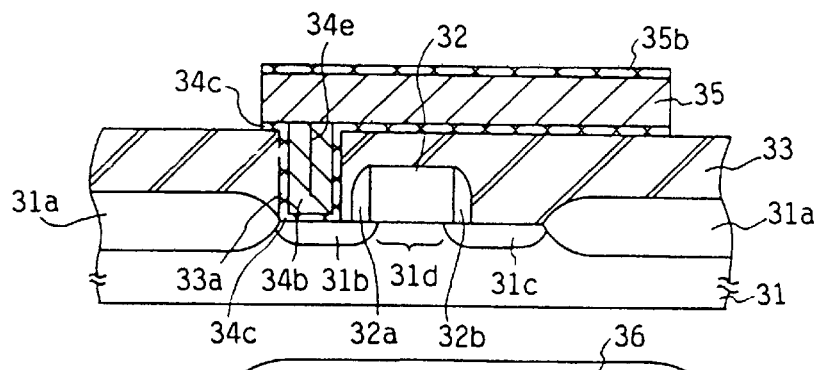
Figure 11H:
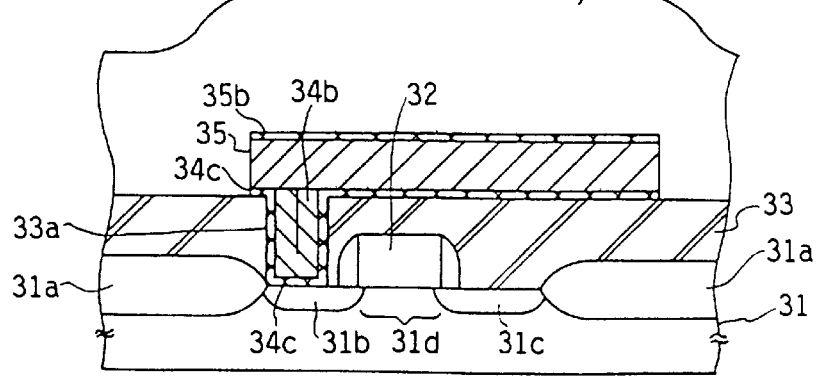

Next, in the step of FIG. 11G, the conductor layer 35 as well as the TiN layers 34c and 35b are patterned, and the structure thus obtained is covered by an interlayer insulation film 36 of typically $SiO_2$ in the step of FIG. 11H. It should be noted that the interlayer insulation film 36 thus formed shows a projection at the top surface thereof in correspondence to the foregoing conductor pattern 35.

Figure 11I:
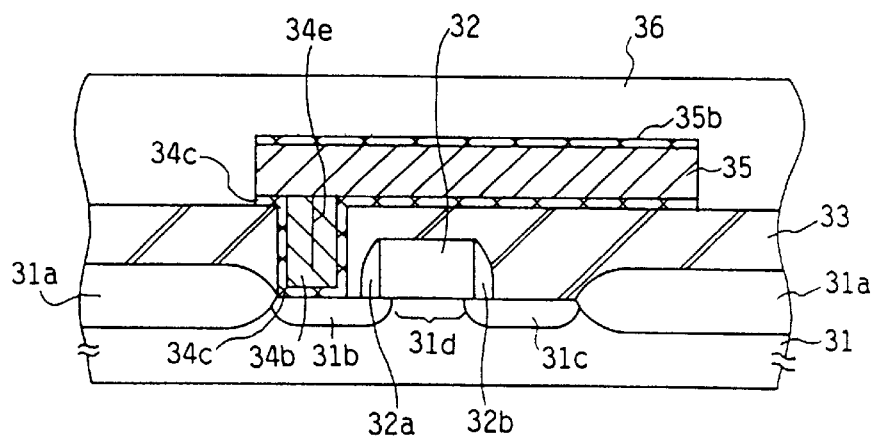
Figure 11J:
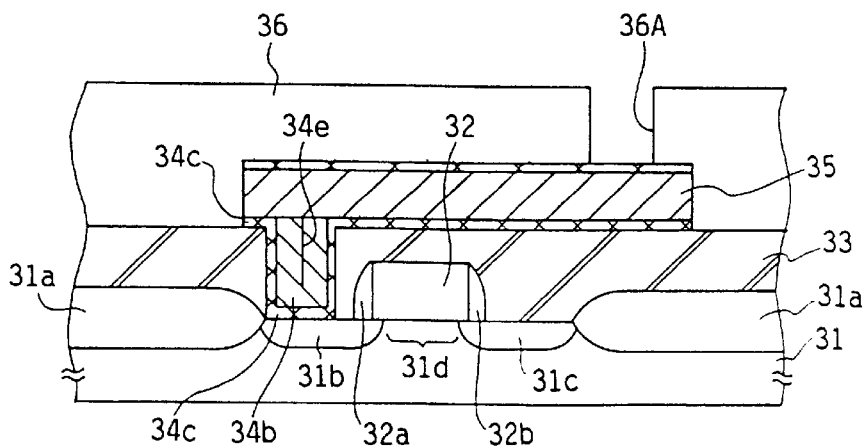
Figure 11K:
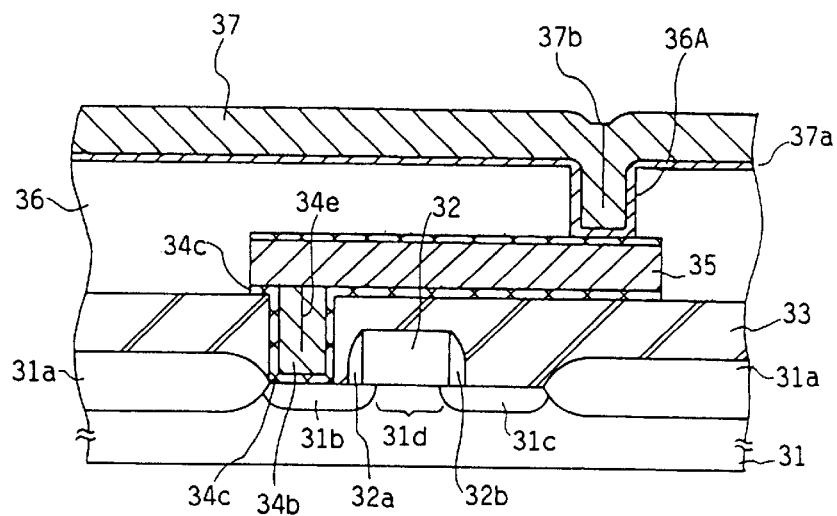
Figure 11L:
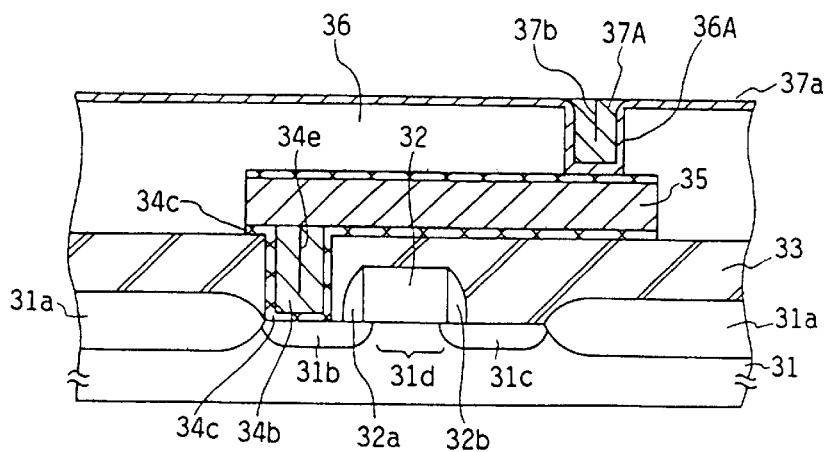

Next, in the step of FIG. 11I, the interlayer insulation film 36 is planarized by a CMP process that uses $Mn_2O_3$ or $Mn_3O_4$ abrasives in the slurry. Further, the interlayer insulation film 36 thus planarized is patterned in the step of FIG. 11J, wherein a contact hole 36A is formed so as to expose the conductor layer 35. Further, a TiN layer 37a and a W layer 37 are deposited consecutively on the interlayer insulation film 36 in the step of FIG. 11K so as to fill the contact hole 36, and a step of FIG. 11L is conducted in which the W layer 37 is removed by a CMP process that uses $MnO_2$ abrasives in the slurry. As a result of the polishing, a conductive plug 37A is formed so as to fill the contact hole 36A. Similarly as before, the conductive plug 37A may include a seam 37b at the central part thereof.

Further, another interconnection pattern or an interlayer insulation film may be provided on the structure of FIG. 11L.

In the foregoing fabrication process of the semiconductor device, it should be noted that a planarization is applied to the insulation film 33 or the interlayer insulation film 36 of $SiO_2$ in the step of FIG. 11B or FIG. 11I by a CMP process that uses abrasives of $Mn_2O_3$, $Mn_3O_4$ or a mixture thereof in the slurry in combination with the construction of FIG. 1. Thereby, the polishing cloth 12 on the platen 10 is subjected to the roughening process simultaneously with the polishing, and the polishing proceed with a high polishing rate with reproducibility or stability as indicated in FIGS. 8 and 9.

As explained already, the abrasives of $MnO_2$, $Mn_2O_3$ or $Mn_3O_4$ are soluble to an acid, and thus, any residual abrasives remaining in the substrate (work piece) or in the polishing rig or apparatus can be removed easily by an acid cleaning process. For this purpose, a cleaning solution containing HCl, $H_2O_2$ and $H_2O$ with a volumetric ratio of 1:1:48 may be used.

It should be noted that the foregoing chemical mechanical polishing process is effective and useful in the fabrication of miniaturized semiconductor devices such as the one having a multilayer interconnection structure or an isolation groove. By using the present invention, both the polishing rate and yield are improved, and the fabrication cost of the semiconductor device is reduced substantially.

Further, the present invention is also effective for polishing a work piece such as a lens.

Further, the present invention is not limited to the embodiments described heretofore, but variations and modifications may be made without departing from the scope of the invention.

What is claimed is:

1. A method of treating a surface of a polishing cloth for use in a chemical mechanical polishing process, comprising the steps of:

treating a surface of said polishing cloth by a slurry used for said chemical mechanical polishing process while simultaneously polishing a work piece on said polishing cloth by said chemical mechanical polishing process, removing abrasives attached to said polishing cloth by a chemical reaction that reacts upon said abrasives.

said treating being conducted such that projections and depressions are formed on said surface, said projection having a height of about 30 µm or less and an interval of about 55 µm or less.

2. A method as claimed in claim 1, wherein said slurry contains abrasive particles and a solvent in which said abrasive particles are dispersed, and wherein said abrasive particles are formed of a manganese oxide having a composition of $MnO_x$ ($1 \leq x \leq 2$).

3. A method as claimed in claim 2, wherein said solvent includes K and has a concentration of K of 900 ppm or less.

4. A method as claimed in claim 2, wherein said abrasive particles are selected from a group consisting of: $MnO_2$, $Mn_2O_3$, $Mn_3O_4$ and a mixture thereof.

5. A method of fabricating a semiconductor device, comprising the steps of:

polishing a surface of a substrate by a chemical mechanical polishing process conducted on a polishing cloth by a slurry, and cleaning said polishing cloth by removing abrasive particles attached to said polishing cloth by a chemical reaction that reacts upon said abrasives, said polishing step being conducted such that projections having a height of about 30 µm or less are formed on said polishing cloth with an interval of about 55 µm or less as a result of said polishing.

6. A method as claimed in claim 5, wherein said slurry contains abrasive particles of a manganese oxide, said manganese oxide being selected from the group consisting of $MnO_2$, $Mn_2O_3$, $Mn_3O_4$ and a mixture thereof.

7. A method as claimed in claim 6, wherein said slurry further contains a solvent in which said abrasive particles are dispersed, wherein said solvent includes K and has a concentration of K of 900 ppm or less.

8. A method of treating a surface of a polishing cloth for use in a chemical mechanical polishing process, comprising the steps of:

treating a surface of said polishing cloth by a slurry used for said chemical mechanical polishing process, and removing abrasives attached to said polishing cloth by a chemical reaction that reacts upon said abrasives, wherein said step of treating is conducted while simultaneously polishing a work piece on said polishing cloth by said chemical mechanical polishing process.

9. A method of fabricating a semiconductor device, comprising the steps of:

polishing a surface of a substrate by a chemical mechanical polishing process conducted on a polishing cloth by a slurry, and cleaning said polishing cloth by removing abrasive particles attached to said polishing cloth by a chemical reaction that reacts upon said abrasives.

* * * * *